(12) United States Patent
Shvydun et al.

(10) Patent No.: US 8,605,527 B2
(45) Date of Patent: Dec. 10, 2013

(54) MECHANISMS FOR BUILT-IN SELF TEST AND REPAIR FOR MEMORY DEVICES

(75) Inventors: Volodymyr Shvydun, Los Altos, CA (US); Saman M. I. Adham, Ontario (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 210 days.

(21) Appl. No.: 13/291,747

(22) Filed: Nov. 8, 2011

(65) Prior Publication Data

US 2013/0021861 A1      Jan. 24, 2013

Related U.S. Application Data

(60) Provisional application No. 61/509,832, filed on Jul. 20, 2011.

(51) Int. Cl.
    *G11C 7/00*        (2006.01)
(52) U.S. Cl.
    USPC .......................................... 365/201; 365/200

(58) Field of Classification Search
    USPC ................. 365/201, 200; 714/7, 6, 8, 42, 723
    See application file for complete search history.

(56) References Cited

U.S. PATENT DOCUMENTS 6,304,989 B1 * 10/2001 Kraus et al. .................. 714/733
6,408,401 B1 *  6/2002 Bhavsar et al. ............... 714/6.2

* cited by examiner

*Primary Examiner* — Vu Le
(74) *Attorney, Agent, or Firm* — Lowe Hauptman & Ham, LLP

(57) ABSTRACT

Mechanisms for self-testing and self-repairing memories are efficient in testing and repairing failed memory cells. The self-test-repair mechanisms are based on self-test results of failed bit map (FBM) data of the entire memories and enable early determination of non-repairable memories to prevent and limit wasting time and resources on non-repairable memories. The self-test-repair mechanisms also involve identifying candidates for column and row repairs and allow repeated repair cycles until either the memories are deemed irreparable or are fully repaired.

20 Claims, 8 Drawing Sheets

MECHANISMS FOR BUILT-IN SELF TEST AND REPAIR FOR MEMORY DEVICES

CLAIM OF PRIORITY

The present application claims the priority of U.S. Provisional Application No. 61/509,832, entitled "Mechanisms for Built-in Self Test and Repair for Memory Devices" and filed on Jul. 20, 2011, which is incorporated herein by reference in its entirety.

CROSS REFERENCES TO RELATED APPLICATIONS

The present application is related to U.S. application Ser. No. 13/291,620, entitled "Mechanisms for Built-In Self Repair of Memory Devices Using Failed Bit Maps and Obvious Repairs," and U.S. application Ser. No. 13/291,707, entitled "Mechanisms for Built-In Self Repair of Memory Devices Using Failed Bit Maps and Obvious Repairs", both of which are filed on the same day of this application and are incorporated herein by reference in their entireties.

FIELD

The present disclosure relates generally to self-testing and self-repairing of memories.

BACKGROUND

Integrated circuits have become key components of many consumer and commercial electronic products, often replacing discrete components and enhancing functionality. The semiconductor processing technologies that produce these integrated circuits have advanced to the point wherein complete systems, including memories, can be reduced to a single integrated circuit, which can be an application specific integrated (ASIC) device or a system-on-a-chip (SOC) device.

Embedded random access memory (RAM) is among the most widely used cores in current ASIC or SOC implementations. Embedded RAM gives rise to two particular problems during chip manufacturing. Because an embedded RAM occupies a significant portion of a chip's area, the probability that a defect lies within the RAM is relatively high. The RAM thus becomes a controlling factor in chip yield. Second, the embedding of RAM not only makes its own testing difficult, but also impairs testability of all other functions on chip, such as the core logic.

DETAILED DESCRIPTION

Figure 1A:
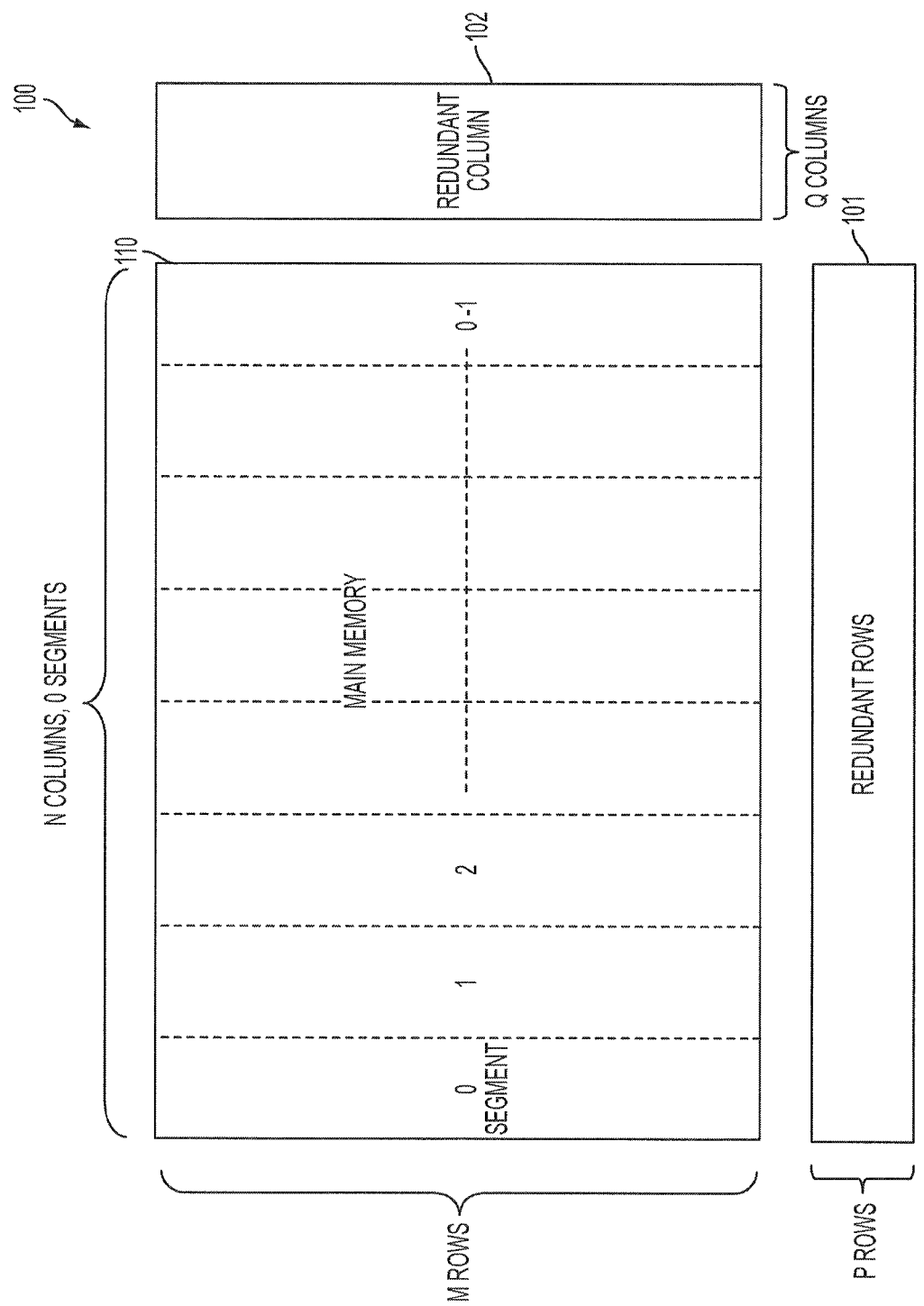
FIG. 1A shows a memory array with redundant rows and columns, in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

As mentioned above, the defect concern in the embedded RAM make testing necessary. In addition, the embedding of RAM not only makes its own testing difficult, but also impairs testability of all other functions on chip, such as the core logic. For example, much of the testing of other functions requires the use of the embedded RAM, which must be functioning properly. The RAM yield problems may be tackled by incorporating a repair scheme with redundant rows and/or columns. If an embedded memory is buried deeply within an ASIC or SOC device, built-in self-test (BIST) and built-in self-repair (BISR) have been used to assist memory repair. However, there are limitations of the existing BIST and BISR mechanisms to meet the requirement of memory repair for advanced devices.

FIG. 1A shows a memory array 100 with redundant rows and columns, in accordance with some embodiments. The memory array 100 could be a part of a memory chip or could be a part of an ASIC or SOC device. Memory array 100 includes a main memory 110, redundant rows 101 and redundant columns 102. The main memory 110 has M rows and N columns. M and N can be any integer number. The values of M and N determine the size of the main memory 110. For example, the main memory 110 may have 288 columns and 512 rows. Other numbers of columns and rows are also possible. In some embodiments, the main memory 110 may be further divided into a number of segments, such as O segments. O can be any integer number. In some embodiments, the segments are equal in size. For example, main memory 110 could have 8 segments, which are divided by columns. Using the exemplary main memory 110 described above, each segment has 36 columns if there are 288 columns and 8 segments.

The redundant rows 101 and the redundant columns 102 are rows and columns of memory cells that are used for repairing failed cells in the main memory 110. In some embodiments, the redundant rows 101 are used for row repair and the redundant columns 102 are used for column repair. The numbers of redundant rows 101 and columns 102 depend on the size of main memory 110 and also on the manufacturing processes used to make main memory 110 and its size. Larger main memory 110 (with more rows and columns) may require more redundant rows and columns to assist in cell repair. In addition, if the processes used to manufacture the device have high yield, the numbers of redundant rows and columns could be lower. In contrast, if the processes have low yield, the numbers of redundant rows and columns needed would be higher. As shown in FIG. 1A, the main memory 110 has P redundant rows and Q redundant columns. P and Q are integers. P is smaller than M and Q is smaller than N, in accordance with some embodiments. For example, if there are 288 columns and 512 rows in main memory 110, there could be 16 redundant rows and 8 redundant columns. Other numbers of redundant rows or columns are also possible. In some embodiments, each redundant column is used to repair failed memory cell(s) in one designated segment. Under such circumstance, Q is equal to O. The memory cell described here may refer to a memory unit, which may comprise a number of transistors.

Figure 1B:
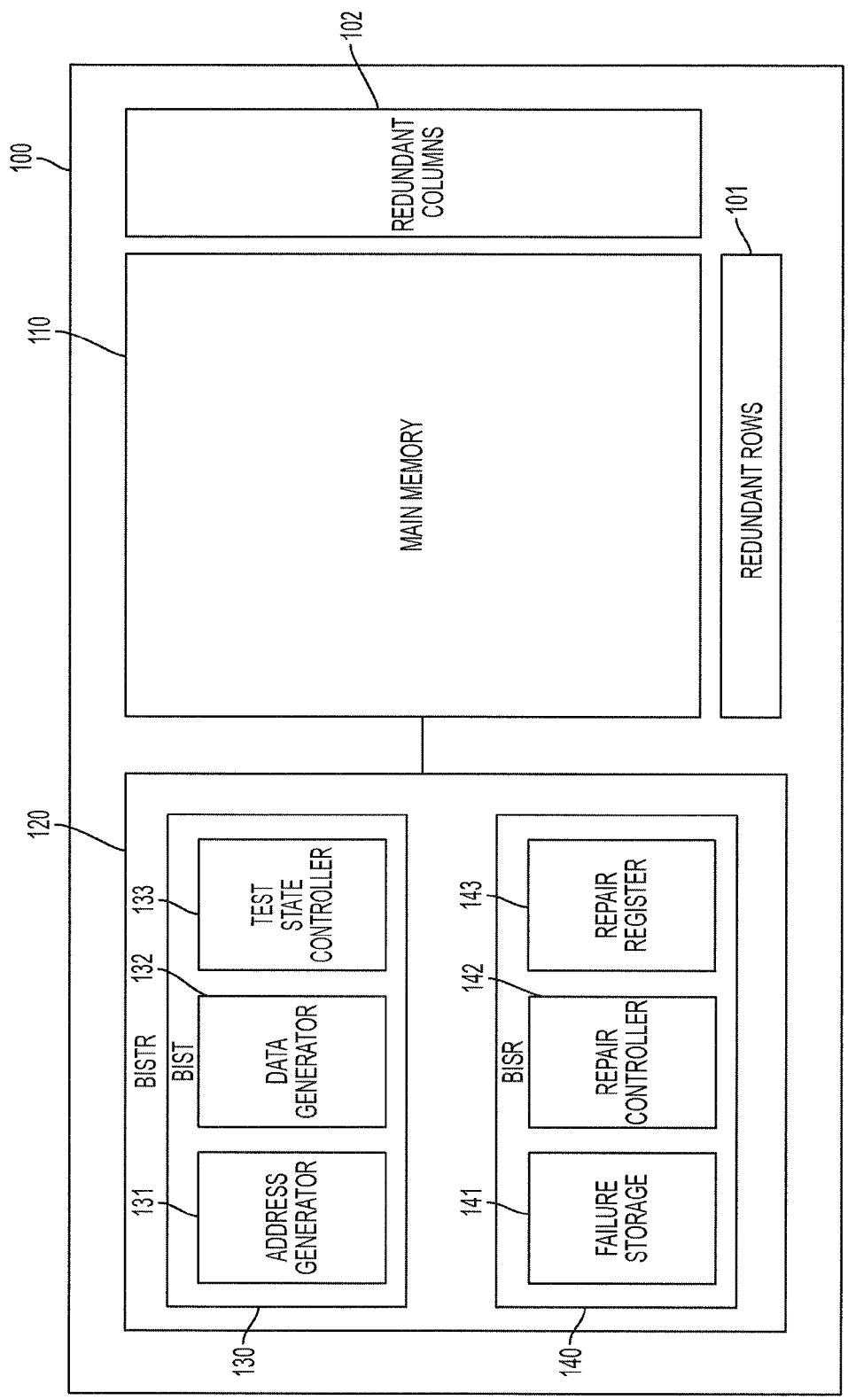
FIG. 1B shows a schematic diagram of a memory array with a built-in self-test-and-repair (BISTR) module, in accordance with some embodiments.

FIG. 1B shows a schematic diagram of the memory array 100 with a built-in self-test-and-repair (BISTR) module 120, in accordance with some embodiments. The BISTR module 120 provides the functions of testing and repairing main memory 110. The BISTR module 120 includes a BIST module 130 for testing the main memory 110 and a BISR module 140 for repairing the main memory 110, in accordance with some embodiments. The BIST module 130 may include an address generator 131, which generates and provides address sequences to the main memory 110 during testing in accordance with some embodiments. The BIST module 130 may further includes a data generator 132, which generates and provides test data sequences to the main memory 110 during testing. The address sequences and the data sequences are generated in orders specified by a test pattern algorithm, in some embodiments. The data sequences may provide a set of data bits to detect various types of faults within the main memory 110. In addition, the BIST module 130 may include a test state controller 133, which provides inputs and control signals to the address generator 131 and the data generator 132. The test pattern algorithm described above may be generated by the test state controller 133. The BIST module 130 may scan the main memory 110 by row, by column, or a combination of both to test the entire main memory 110.

The BISR module 140 may analyze the received error (or failure) data generated from testing the main memory 110. The error (or failure) data may include an address(es) of the error(s) (or failed cells), also possibly along with the other received (or collected) error information, to determine the repair mechanism(s). Depending on the location and distribution of the error data, the repair could be done by row repair and/or column repair. The BISR module 140 may include a failure storage 141, which stores addresses of the failed memory cells. The failure storage 141 may also store the failure types associated with the failed memory cells. However, the storage of the failure types is not necessary.

The BISR module 140 may further include a repair controller 142 and a repair register 143. The repair controller 142 analyzes the failure data stored in failure storage 141 and determines the repair method(s), such as by row repair, by column repair, or by a combination of both. After the repair controller 142 determines the repair method(s), it issues a repair instruction to the repair register 143. The repair instruction may include the address(es) of row(s) and/or column(s) in the main memory 110 being repaired and the address(es) of redundant row(s) and/or redundant column(s) used for the repair(s). The repair register 143 then records the addresses received from the repair controller 142. When the memory array 100 is operated under read or write mode, the read/write address(es) is first checked against the repair addresses stored in the repair register 143 to see if the read/write address(es) is included in the repair register 143. If the answer is yes, the read/write would be performed on correlated address(es) in the redundant row(s) or column(s) used for the repair.

The repair controller 142 may use a relatively simple "repair-on-the-go" algorithm to repair faulty memory cells. For example, the BISR module 140 may repair the detected failed memory cells as soon as they are discovered. As mentioned above, the BIST module 130 scans the main memory 110 and sends failure information to failure storage 141. The repair controller 142 may initiate repair based on the available failure data in the failure storage 141 before the scanning of the entire main memory 110 is completed. Such repair algorithm is relatively simple to implement and the failure storage 141 required is relatively small. For example, if the test sequences generated by the BIST module 130 identify a particular row of a failed cell, the failure location is sent to the failure storage 141. When the repair controller 142 detects such error, the repair controller 142 could immediately initiate a row repair. Afterwards, the BISTR 120 continues with the scanning (and testing) and repairing of the remaining portion of the memory. One issue facing such a repair algorithm is that the repair methods used might not be ideal for the failure patterns of the main memory 110, because the repair method is determined based on limited failure data. For example, a row repair might have been used to repair a single error in a row before it is discovered that the column associated with one of the row failure has multiple failures. A column repair would have been a better choice. By using non-optimized or poor repair methods, the redundant rows and/or columns could run out before the entire main memory 110 is scanned. As a result, some failed cells might not be repaired due to lack of redundancy. The built-in self-test-and-repair of the main memory 110 would then be deemed to have failed and the main memory 110 is marked as un-repairable. Therefore, the simple "repair-on-the-go" algorithm is not ideal.

Figure 2A:
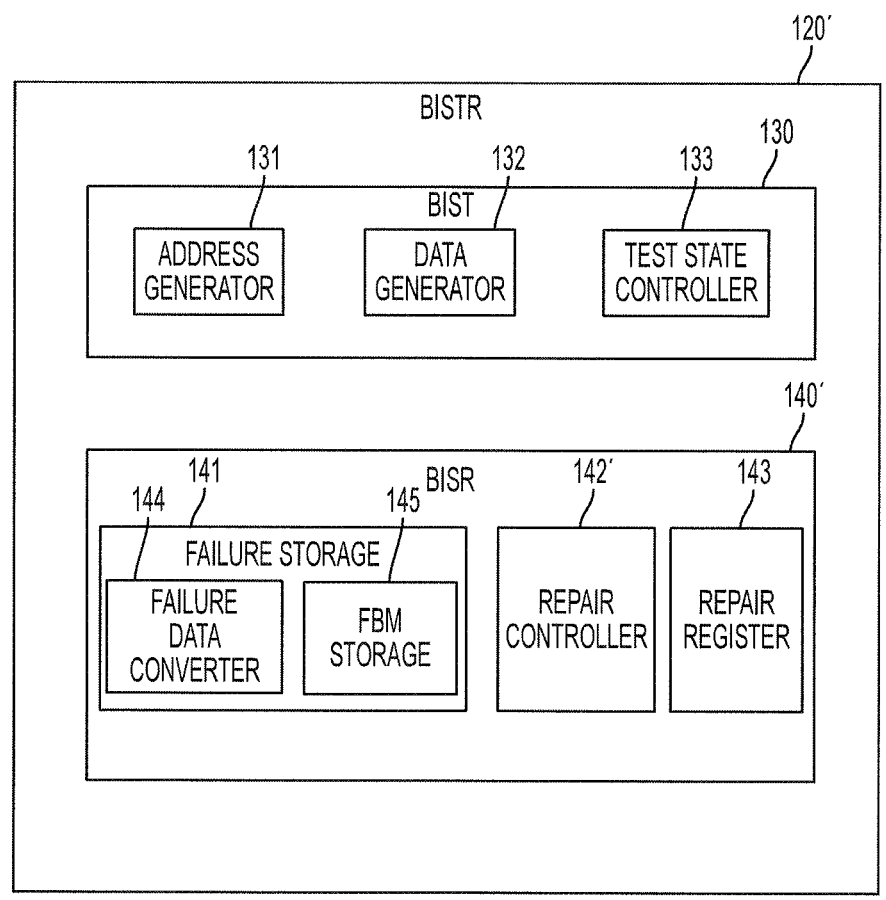
FIG. 2A shows a schematic diagram of a built-in self-test-and-repair (BISTR) module, in accordance with some other embodiments.
Figure 2B:
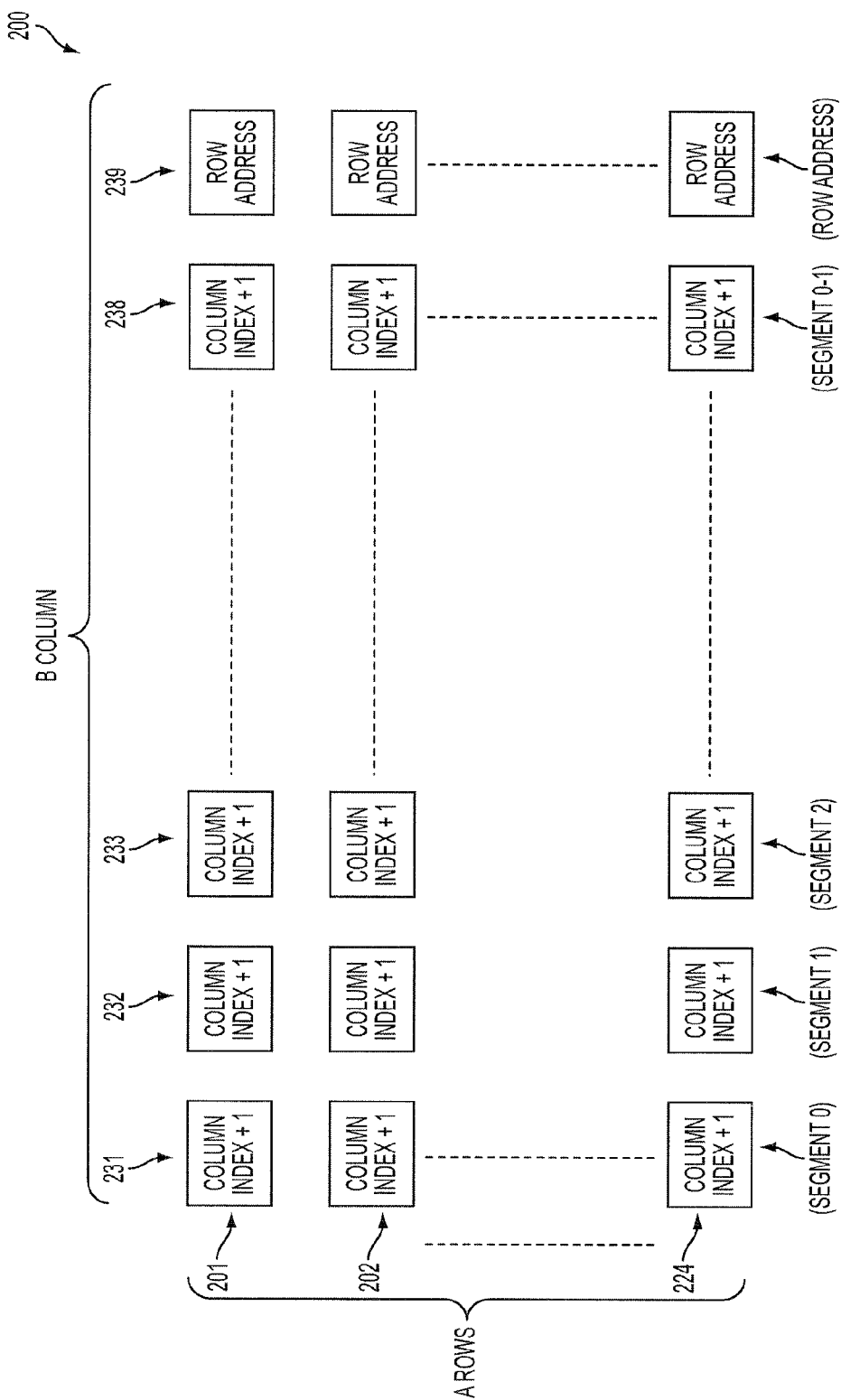
FIG. 2B shows a schematic diagram of a built-in self-repair (BISR) module, in accordance with some embodiments.

FIG. 2A shows a schematic diagram of a built-in self-test-and-repair (BISTR) module 120', in accordance with some embodiments. The BISTR module 120' may be used to test and repair main memory 110 in a manner similar to the BISTR module 120 described above in many aspects. For example, the BIST module 130 in the BISTR module 120' of FIG. 2A is similar to the memory BIST module 130 of FIG. 1B. However, the repair algorithm of BISR module 140' is different from the repair algorithm of the BISR module 140 described above. The BIST module 140' collects and analyzes one or more failure bit maps (FBMs), which store failure data of the entire main memory 110, before it determines the repair method(s). As shown in FIG. 2B, the BISR module 140' includes a failure storage 141', which includes a failure data converter 144 and a failure bit map (FBM) storage 145, in accordance with some embodiments. The failure data generated from BIST module 130 is stored in the FBM storage 145. To save the memory space required to save the entire main memory 110, the failure data stored in the FBM storage 145 are compressed failure data, which are generated (or converted) by the failure data converter 144 from failure data generated the testing sequence of BIST 130.

The failure data stored in failure bit map (FBM) storage 145 are stored in bits. For example, if the main memory 110 has 288 columns with 8 segments, each segment has 36 columns, such as columns 0, 1, 2, . . . , 35. Six bits can be used to describe locations of 36 columns. FIG. 2B shows a FBM data structure 200, in accordance with some embodiments. The FBM data structure 200 includes "A" number of rows and "B" number of columns. A and B are both integers. Larger A and B allow storing more failure data with the down side of taking up extra memory space or additional real-estate on the chip. However, if the A and B are too small, it runs the risk of not being able to capture all failure data. In some embodiments, the A number is equal to or greater than the number of repair rows. The number B is equal to the number of repair column +1, in some embodiments. For example, the number A may be in a range from about 16 to about 50, and the number B may be in a range from about 8 to about 50. In some other embodiments, the number A is in a range from about 8 to about 50. Number B may be in a range from about 4 to about 100, in some embodiments.

As described above, there are P redundant rows and Q redundant columns in memory array 100. The FBM data structure 200 includes P+Q rows and Q+1 columns, in accordance with some embodiments. However, the number of rows in FBM data structure 200 may be larger or smaller than P+Q. As mentioned above, Q may be equal to 0 (number of segments) and each redundant column is assigned to a column repair failure in each segment. Using the example mentioned above of having 16 redundant rows and 8 redundant columns, the FBM data structure 200 may have 24 rows and 9 columns in accordance with some embodiments. One of the columns, such as the (Q+1)th column, is used to record a row address of a column fail. The address of the failed column is represented by bits. Using the example mentioned above, for main memory 110 with 288 columns and 8 segments, 8 out of the 9 columns are used to store column addresses of failed cells (or bits) for 8 segments. Each segment uses one of the 8 columns to record failure data in the segment. The additional column is used to store row addresses of failed cells, as shown in FIG. 2B in accordance with some embodiments.

The column address of the failed cell may be represented by a column index plus 1 (or +1). For example, the addresses of a segment with 36 columns can be represented by 6 bits. To allow a "0" bit address (000000) to be used to represent zero (0) fail in a particular segment, the failed column address is represented by a "column address+1." For example if the second column 000001 (the first column being 000000) of a segment fails, the failed column address is represented by 000010 (000001+1). Since there are only 36 columns, the bit address of 111111 (a special code) reflects a non-existing column; therefore, it can be used to represent the existence of failures in more than one columns in the particular segment. In the example here, only one redundant column is available to repair a column fail in a segment. Because there are more than one failed column in a segment of a particular row (or a segment violation), the repair needs to rely on the usage of redundant row(s).

Figure 2C:
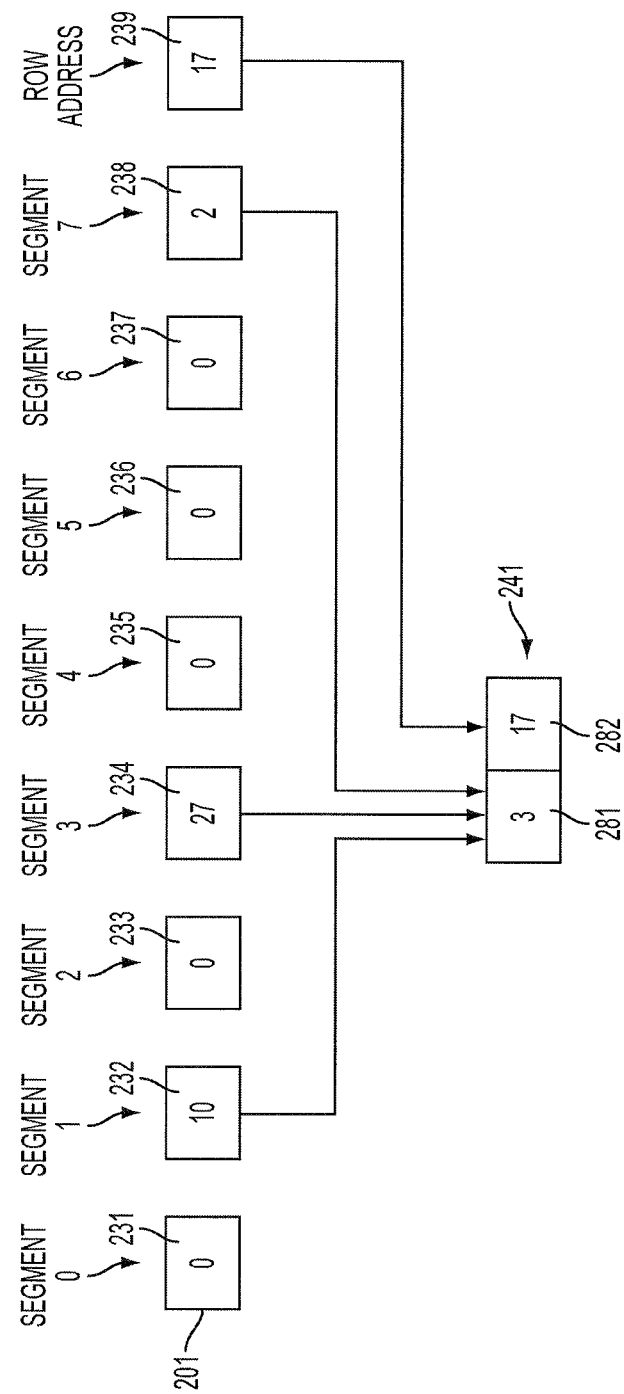
FIG. 2C shows the results of a row and a summary of the results in a table, in accordance with some embodiments.

The FBM data structure 200 is populated by the failure test results generated from the test sequences of BIST module 130. FIG. 2C shows exemplary data in row 201 of FBM data structure 200. The data have been translated from bits to numbers for ease of understanding. In reality, the data in row 201 are stored in bits. The data in row 201, or first row of FBM data structure 200 of FIG. 2B, show that the row address of row 201 is "17", which represents the $18^{th}$ row of main memory 110 in accordance with some embodiments. The data in row 201 also show that there are zero errors in segments 0, 2, and 4-6. The data also shows that there are errors at column 9 (derived from 10-1) of segment 0, at column 26 of segment 3, and column 1 of segment 7. FIG. 2C shows that the results of row 201 are summarized in a table 241 with a totality of 3 errors (field 281) in row 17 (field 282). Similar tables may also be constructed for other rows. Rows with high number of errors are candidates for row repair.

Figure 2D:
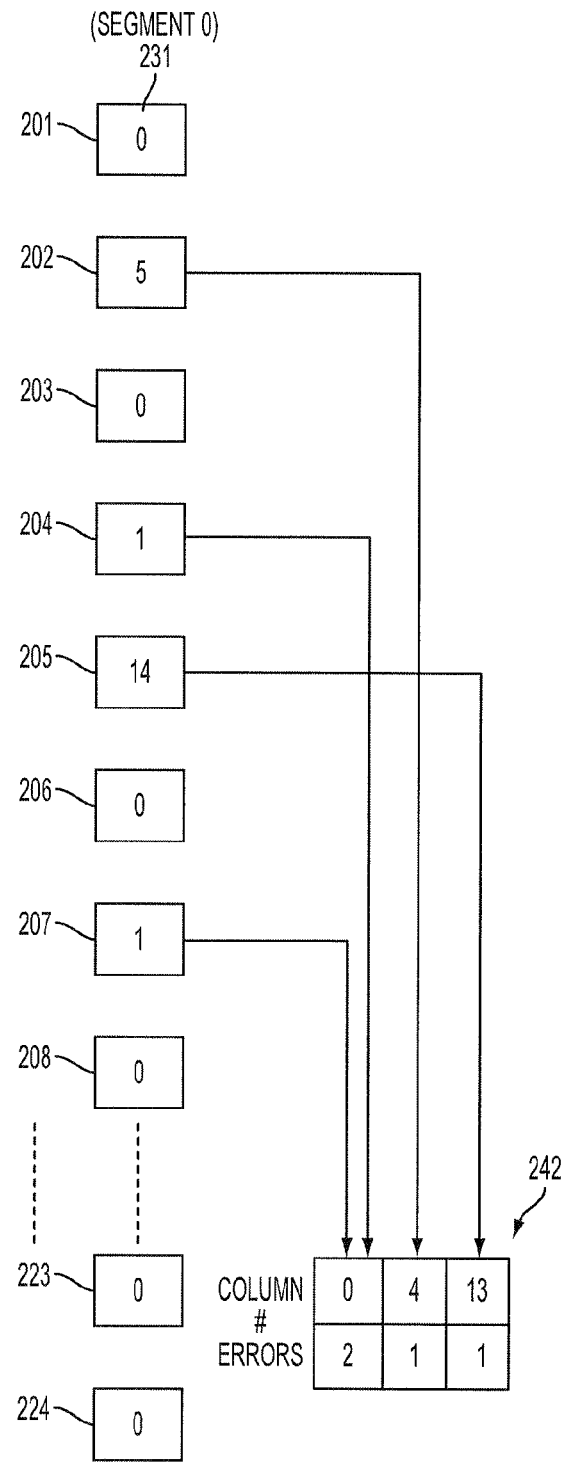
FIG. 2D shows data of the results of a segment column and a summary of the results, in accordance with some embodiments.

FIG. 2D shows data in column 231 of FBM data structure 200, in accordance with some embodiments. Column 231 is the $1^{st}$ column of FBM data structure 200 and it stores failure data of segment 0. The data in FIG. 2D show that there are errors in column indexes 5, 1, and 14, which represent column numbers 4 (derived from 5-1), 0, and 13. There is no other error in segment 0. Each error has a row number associated with it. However, the associated row numbers are not shown in FIG. 2D. The data in column 231 is further organized and compressed into Table 242 from highest errors (2) in a particular column number (column 0) to the lowest number of errors (0 in this case). Table 242 shows that column 0 (or 1-1) has 2 errors, column 4 has 1 error and column 13 has 1 error. By organizing the data in column 231 in the format of Table 242, it is easy to see which column has the highest number of errors. Columns with high number of errors are candidates for column repair. Tables with compressed data that are similar to Table 242 can be generated for other segments, such as segments 1-7 or columns 232-238 of FIG. 2B. In some embodiments, both Tables 241 and 242 are also stored in FBM storage 145. In some embodiments, summary data, such as Tables 241 and 242, are not necessary. A comparing algorithm can be used to determine the number and/or order of failures in rows and/or columns.

Figure 3A:
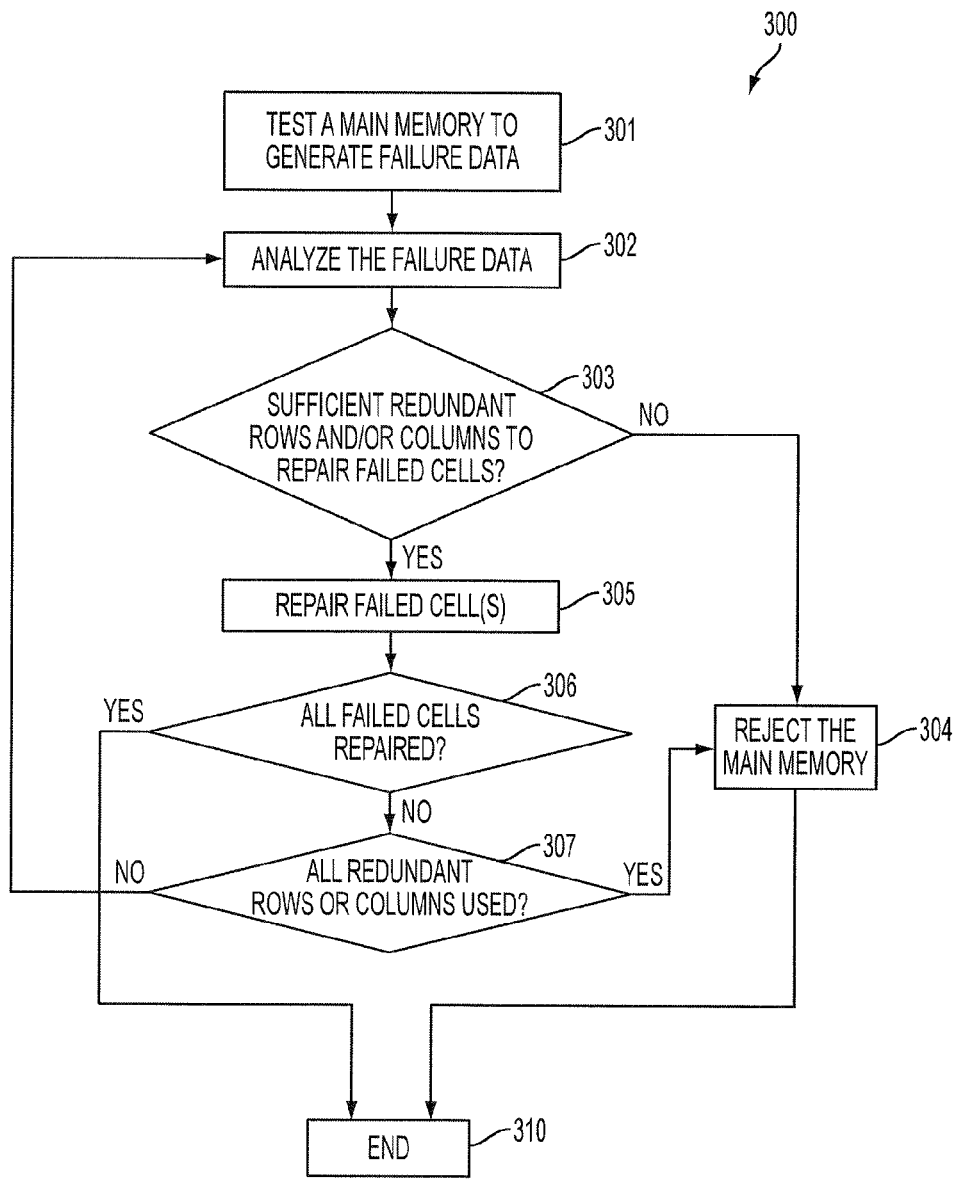
FIG. 3A shows a method of repairing failed cells of a main memory, in accordance with some embodiments.

FIG. 3A shows a method 300 of repairing failed cells of main memory 110, in accordance with some embodiments. Method 300 starts at operation 301 of testing the main memory 110 to generate failure data of the entire main memory 110. As mentioned above, the failure data are generated by scanning the rows and/or columns of main memory 110 and could be stored in one or more failure bit maps (FBMs). For example, the FBM may be stored in a FBM data structure 200 described above. The testing sequence and instruction may be generated by a BIST module, such as the BIST module 130 described above. In some embodiments, the FBM data are further organized and compressed into other tables or data structure(s) to organize the failure data in rows or columns in different segments, such as those described in Tables 241 and 242. At operation 302, the failure data, which may include the FBM data and/or their data summary, are analyzed in order to determine the repair method. At operation 303, a decision of whether there are sufficient redundant rows and/or columns to repair the failed cells is made. In some embodiment, the decision at operation 303 is a simple decision of whether redundancy is available. If the answer is "no", the main memory 110 is rejected (or considered not-repairable) at operation 304, which is followed by an end operation 310. By determining the main memory 110 to be not-repairable early on, the time and resources spent on further testing and repairing the main memory can be saved.

If the answer to the question at operation 303 is "yes", method 300 proceeds to operation 305 of repairing the failed cells. The repair can be done by either column repair or row repair. An embodiment of an algorithm used to determine the repair method will be described below. After repair of memory cells is performed at operation 305, method 300 proceeds to operation 306 to determine if all failed cells are repaired. If the answer is "yes", the repair work is completed and the method proceeds to the end operation 310. If the answer is "no," method 300 proceeds to operation 307 of determining if all redundant rows or columns are used. If the answer is "yes," the main memory 110 is considered not repairable and the method proceeds to operation 304. Otherwise (or if the answer is "yes" to the question at operation 307), method 300 returns to operation 302 to analyze the revised failure data (FBM and summary data) and to determine the repair method. The FBM and summary data are revised after repair is performed. The error data can be cleared from the FBM and data summaries. In some embodiments, the repair involves registering a repaired row or column and address of redundancy used for the repair. The end results of method 300 are either a completely repaired main memory 110 or a non-repairable and rejected main memory 110. In some embodiments, the non-repairable main memory 110 can be marked as a lower-grade memory with the addresses of un-repaired rows and/or columns recorded, if there are not too many of them, and can still be sold or used.

The FBM data and the optional summary data described in the embodiments above enable reviewing the entire FBM to identify the best repairing mechanism. Thus the repair mechanism is better and more efficient than the a "repair-on-the-go" algorithm (or method), which is determined only based on limited or partial (or incomplete) data. At the same time, the compressed data format(s) used in the FBM and/or summary data structures limits the resources used to capture the FBM and/or summary data.

Figure 3B:
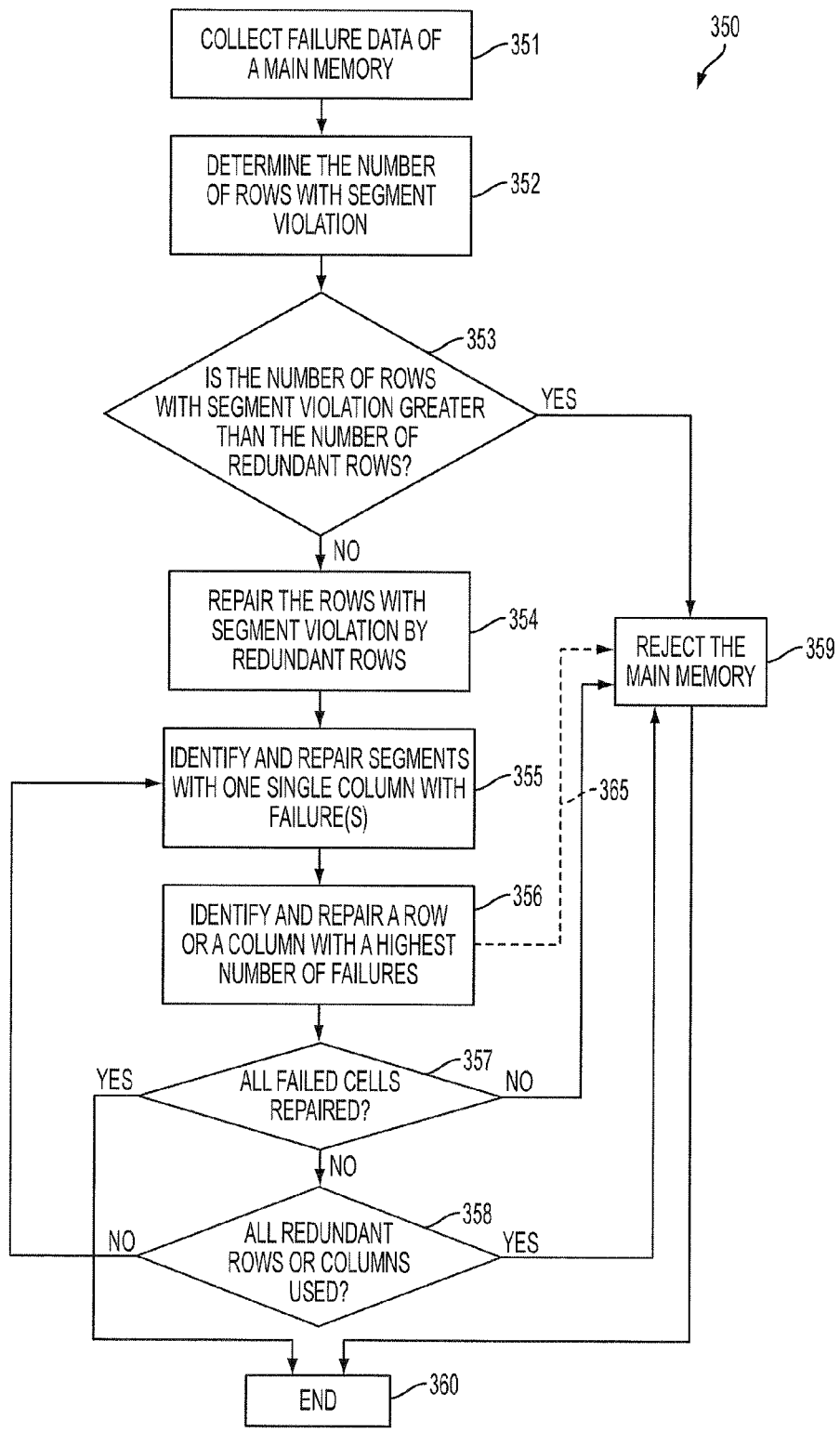
FIG. 3B shows a method of repairing failed cells of a main memory, in accordance with some other embodiments.

FIG. 3B shows a more detailed repair method 350 of main memory 110, in accordance with some embodiments. The method 350 starts at operation 351 of collecting failure data of the entire main memory 110, such as the FBM data described above. After the failure data are collected, method 350 proceeds to operation 352 of determining the number of rows with a segment violation, which means there are 2 or more failures in a segment. As mentioned above, if there are two or more failures in a segment, the column index is entered as "111111", for example, to signal that there is more than 1 failed cell in a particular segment. As described in the example above, one redundant column is assigned to repair column failures in one segment. Therefore, failures in one column of a segment are repairable. Two or more columns with failures are repairable by the single redundant column designated for the segment. As a result, if column index indicates there are two or more failures in a particular segment (or with column index 111111 entered, for example), a segment violation has occurred. A segment with a segment violation indicates that row repair is needed, since repair solely by column repair is not sufficient and will not work. Rows associated with a segment violation would need to be repaired by row repair using redundant row(s).

At operation 352, the number of rows with a segment violation is determined. Afterwards, at operation 353, a decision of whether the number of rows with a segment violation is greater than the number of redundant rows is made to determine whether there are a sufficient number of redundant rows for the repair. If the answer is "yes," the method 350 proceeds to operation 359 of rejecting the main memory 110 and the main memory 110 is deemed un-repairable due to insufficient redundancy. The operation 359 is then directed to an end operation 360.

If the answer to the determining operation 353 is "no," the row(s) with a segment violation is repaired by row repair at operation 354. As mentioned above, the repair controller, such as repair controller 142, may issue a repair instruction to the repair register, such as repair register 143, to record the addresses of failed row(s) being repaired and redundant row(s) being used to repair the failed row(s). After the repair is done, the FBM and summary data associated with the repaired rows are cleared to reflect that they have been repaired.

After operation 354 is completed, segments, which are reflected by columns of the FBM data structures, with a single column with error(s) are identified and repaired at operation 355. A segment with only one column with error(s) can easily be repaired by the dedicated redundant column. As a result, segment and/or summary data, such as FBM data and/or data in segment Table 232, are reviewed to identify segments with a single column with an error(s). Similarly, the repair controller may issue a repair instruction to the repair register after the repair is done. The FBM and summary data associated with the repaired column(s) may also be cleared to reflect the repair.

The row and column repair described above in operations 353-355 are relatively simple to identify and to repair. After such simpler targets are removed, method 350 proceeds to identify and repair next-best candidates, in accordance with some embodiments. At operation 356 a row or a column with a highest number of failures is identified and repaired. If the highest number of failures comes from a column, a column repair is performed. Otherwise, a row repair is performed. Such a repair mechanism enables efficient usage of redundant rows or columns. Similarly, after the repair is performed, the FBM and summary data are refreshed to reflect the repair and the repair is registered. If there is no available redundant row or column for the repair, method 350 would proceed to operation 359, which is demonstrated by the dotted line 365 between operations 356 and 359. Otherwise, method 350 proceeds to the next operation (operation 357).

Following operation 356, method 350 proceeds to operation 357 to determine if all failed cells are repaired. If the answer is "yes," the repair work is completed and the method proceeds to the end operation 360. If the answer is "no," method 350 proceeds to operation 358 of determining if all redundant rows or columns are used. If the answer is "yes," the main memory 110 is considered not repairable and the method proceeds to operation 359. Otherwise, method 350 returns to operation 355 to analyze the revised failure data (FBM and summary data) and to continue determining the repair methods. The end results of method 350 are either a completely repaired main memory or a non-repairable main memory.

The embodiments of mechanisms described above may be used to self-test and self-repair any type of RAM, including volatile and non-volatile memories, such as static RAM (SRAM), dynamic RAM (DRAM), or flash memory, etc. The built-in self repair analysis circuit is configurable (or parameterizable) to support different sizes and configurations of memories. The repair solutions can be designed to optimize repair efficiency for memories with different sizes and configurations for different test time specifications and different available areas (for test and/or repair devices) on chips. Although the examples described above involve a redundant column for a segment, more than one redundant column may be reserved for a particular segment. When this occurs, the repair methods need to be adjusted accordingly. For example, the criteria of segment violation would be different with the number of columns with failures in a segment adjusted accordingly. Alternatively, rows can also be divided into segments and redundant rows can be assigned to dedicated segments.

The embodiments of self-testing and self-repairing mechanisms for memories described above are efficient in testing and repairing failed memory cells. The self-test-repair mechanisms utilize self-test results of failed bit map (FBM) data of the entire memories to make the repair more efficient. The mechanisms also enable early determination of non-repairable memories to prevent and limit wasting resources on non-repairable memories. The self-test-repair mechanisms further involve identifying candidates for column and row repairs and enable repeated repair cycles until either the memories are deemed irreparable or are fully repaired. The additional circuit space needed for the failure bit map (FBM) storage is relatively small compared to the overall size of the memory array.

In some embodiments, a method of self-testing and self-repairing a random access memory (RAM) is provided. The method includes collecting failure data of the RAM, and the failure data include addresses of failed cells. The failure data are stored in a failure bit map (FBM). The RAM has a first number of redundant rows and a second number of redundant columns. The columns are divided into the second number of segments, and each of the redundant columns is used for column repair of a designated segment. The method also includes analyzing the failure data to determine if there are sufficient redundant rows and redundant columns to repair the failed cells in the RAM. The method further includes repairing at least a portion of the failed cells by using the redundant rows and redundant columns if there are sufficient redundant rows and redundant columns to repair the failed cells. In addition, the method includes rejecting the RAM if there are not sufficient redundant rows and redundant columns to repair the failed cells.

In some other embodiments, a method of self-testing and self-repairing a random access memory (RAM) is provided. The method includes collecting failure data of the RAM, and the failure data include addresses of failed cells. The failure data are stored in a failure bit map (FBM). The RAM has a first number of redundant rows and a second number of redundant columns, and the columns are divided into the second number of segments. Each of the redundant columns is used for column repair of a designated segment. The method also includes analyzing the failure data to determine if there are sufficient redundant rows and redundant columns to repair the failed cells in the RAM. The analyzing includes determining if the number of rows with a segment violation is greater than the first number of redundant rows, and the segment violation means that there are failed cells in two or more columns in a segment for a particular row. In addition, the method includes repairing at least a portion of the failed cells by using the redundant rows and redundant columns if there are sufficient redundant rows and redundant columns to repair the failed cells. Additionally, the method includes rejecting the RAM if there are not sufficient redundant rows and redundant columns to repair the failed cells and repeating the repairing operation until either the RAM is rejected or all of the failed cells are repaired.

In yet some other embodiments, a memory array with a built-in self-test (BIST) module and a built-in self-repair (BISR) module to repair a main memory of the memory array is provided. The memory array includes the main memory, a first number of redundant rows for row repair of the main memory, and a second number of redundant columns for column repair of the main memory. The main memory is evenly divided into the second number of segments and each redundant column is assigned for column repair in an assigned segment. The memory array also includes the BIST module for testing the main memory, and the BISR module for repairing the main memory by using the redundant rows and redundant columns. The BISR module performs repair based on a failure bit map (FBM) generated from testing the entire main memory.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of self-testing and self-repairing a random access memory (RAM):
    collecting failure data of the RAM, wherein the failure data include addresses of failed cells, wherein failure data are stored in a failure bit map (FBM), wherein the RAM has a first number of redundant rows and a second number of redundant columns, and wherein the columns are divided into the second number of segments, and wherein each of the redundant columns is used for column repair of a designated segment;
    analyzing the failure data to determine if there are sufficient redundant rows and redundant columns to repair the failed cells in the RAM;
    repairing at least a portion of the failed cells by using the redundant rows and redundant columns if there are sufficient redundant rows and redundant columns to repair the failed cells; and
    rejecting the RAM if there are not sufficient redundant rows and redundant columns to repair the failed cells.

2. The method of claim 1, further comprising:
    repeating the repairing operation until either the RAM is rejected or all of the failed cells are repaired.

3. The method of claim 1, wherein analyzing the failure data to determine if there are sufficient redundant rows and redundant columns to repair the failed cells in the RAM includes determining if the number of rows with a segment violation is greater than the first number of redundant rows, wherein the segment violation means that there are failed cells in two or more columns in a segment for a particular row.

4. The method of claim 1, wherein the FBM has a data structure with a third number of rows, and wherein the data structure is configured to be large enough to contain all failure data.

5. The method of claim 1, wherein the addresses of failed cells are represented by bit addresses, and wherein locations of the failed cells are represented by codes associated with their row addresses and column addresses.

6. The method of claim 1, wherein the collecting of the failure data of the RAM is enabled by a built-in self-test (BIST) module, and wherein the analyzing and the repairing are performed by a built-in self-repair (BISR) module, and wherein the BIST and the BISR modules are integrated with the RAM.

7. The method of claim 1, wherein analyzing the failure data to determine if there are sufficient redundant rows and redundant columns to repair the failed cells in the RAM prevents wasting time and resources in repairing un-repairable RAM.

8. The method of claim 1, wherein repairing at least a portion of the failed cells by using the redundant rows and redundant columns includes identifying and repairing segments with one single column with failures in the segments, and wherein the segments are repaired by redundant columns.

9. The method of claim 1, wherein repairing at least a portion of the failed cells by using the redundant rows and redundant columns includes identifying and repairing a row or a column with a highest number of failures.

10. The method of claim 1, wherein the RAM is selected from a group consisting of static RAM (SRAM), dynamic RAM (DRAM), and flash memory.

11. The method of claim 4, wherein the first number is in a range from about 16 to about 50 and the second number is in a range from about 8 to about 50.

12. The method of claim 1, wherein the method is configurable to optimize repair efficiency for the RAM with an available area for integrated circuits of the self-testing and self-repair method.

13. A method of self-testing and self-repairing a random access memory (RAM):
    collecting failure data of the RAM, wherein the failure data include addresses of failed cells, wherein the failure data are stored in a failure bit map (FBM), wherein the RAM has a first number of redundant rows and a second number of redundant columns, and wherein the columns are divided into the second number of segments, and wherein each of the redundant columns is used for column repair of a designated segment;

analyzing the failure data to determine if there are sufficient redundant rows and redundant columns to repair the failed cells in the RAM, wherein the analyzing includes determining if the number of rows with a segment violation is greater than the first number of redundant rows, wherein the segment violation means that there are failed cells in two or more columns in a segment for a particular row;

repairing at least a portion of the failed cells by using the redundant rows and redundant columns if there are sufficient redundant rows and redundant columns to repair the failed cells;

rejecting the RAM if there are not sufficient redundant rows and redundant columns to repair the failed cells; and repeating the repairing operation until either the RAM is rejected or all of the failed cells are repaired.

14. A memory array with a built-in self-test (BIST) module and a built-in self-repair (BISR) module to repair a main memory of the memory array, comprising:

the main memory;

a first number of redundant rows for row repair of the main memory;

a second number of redundant columns for column repair of the main memory, and wherein the main memory is evenly divided into the second number of segments and each redundant column is assigned for column repair in an assigned segment;

the BIST module for testing the main memory; and the BISR module for repairing the main memory by using the redundant rows and redundant columns, and wherein the BISR module performs repair based on a failure bit map (FBM) generated from testing the entire main memory.

15. The memory array of claim 14, wherein the BIST module includes an address generator, a data generator, and a test state controller, wherein a test pattern controlled by the test state controller is generated by the address generator and the data generator.

16. The memory array of claim 14, wherein the BIST module includes a failure storage for storing failure data, a repair controller for analyzing the failure data to determine the repair method, and a repair register for registering the repaired rows and columns and the redundant columns and rows used, and wherein the failure storage includes the FBM, and wherein the FBM is updated after the repair is performed.

17. The memory array of claim 16, wherein the failure storage further includes a failure data converter, wherein the failure data converter generates compressed failure data to be stored in a data structure for the FBM.

18. The memory of claim 14, wherein the FBM is stored in a data structure with a third number of rows, and wherein the third number is equal to a sum of the first number and the second number, and wherein the data structure has a fourth number of columns, and wherein the fourth number is equal to the second number plus 1.

19. The memory of claim 18, wherein the second number of columns in the data structure is used to store column indexes of failed cells, and the additional column stores row addresses of the failed cells.

20. The memory of claim 19, wherein the addresses of failed cells are represented by bit addresses, and wherein locations of the failed cells are represented by their row addresses and column indexes, and wherein in a zero column address of a particular row represents no failure in a corresponding segment, and wherein more than one failures in a segment of a selected row is represented by a special code in the bit address.

* * * * *